United States Patent
Abe

(10) Patent No.: US 6,806,775 B2
(45) Date of Patent: Oct. 19, 2004

(54) POWER AMPLIFIER CIRCUIT

(75) Inventor: Hiroyuki Abe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/425,661

(22) Filed: Apr. 30, 2003

(65) Prior Publication Data
US 2004/0150479 A1 Aug. 5, 2004

(30) Foreign Application Priority Data
Jan. 31, 2003 (JP) ........................................ 2003-024579

(51) Int. Cl.[7] .............................................. H03F 3/04
(52) U.S. Cl. ...................................... 330/297; 330/296
(58) Field of Search ................................ 330/297, 296, 330/285, 289, 298, 207 P

(56) References Cited

U.S. PATENT DOCUMENTS 5,986,509 A * 11/1999 Lohninger .................. 330/290
6,052,032 A * 4/2000 Jarvinen ..................... 330/289
6,373,329 B2 4/2002 Hosoi et al.
6,492,875 B2 * 12/2002 Luo et al. ................... 330/296
6,690,237 B2 * 2/2004 Miyazawa .................. 330/285

* cited by examiner

Primary Examiner—Henry Choe
(74) Attorney, Agent, or Firm—Oblon, Spivak, McClelland, Maier & Neustadt, P.C.

(57) ABSTRACT

A power amplifier circuit disclosed herein comprises an amplifying part transistor including a bipolar transistor to which a first supply voltage is supplied as a driving voltage and which amplifies an input signal inputted to a base of the amplifying part transistor so as to output the input signal; a bias current generating circuit which generates a bias current for biasing the base of the amplifying part transistor and supplies the bias current to the base of the amplifying part transistor when the amplifying part transistor performs an amplification operation; and an additional bias current generating circuit which supplies an additional bias current to the base of the amplifying part transistor in addition to the bias current according to the first supply voltage.

10 Claims, 13 Drawing Sheets

POWER AMPLIFIER CIRCUIT

CROSS REFERENCE TO RELATED APPLICATION

This application claims benefit of priority under 35 U.S.C.§119 to Japanese Patent Application No. 2003-24579, filed on Jan. 31, 2003, the entire contents of which are incorporated by reference herein.

BACKGROUND OF THE INVENTION

1. Field of the Invention

The present invention relates to a power amplifier circuit which amplifies an inputted input signal and outputs it as an output signal.

2. Description of the Related Art

FIG. 11 is a diagram showing the configuration of a related power amplifier circuit 5 using bipolar transistors and its peripheral circuit, and FIG. 12 is a diagram showing the static characteristic of an amplifying part transistor Q in FIG. 11.

As shown in FIG. 11, a voltage of 3.6 V, for example, is supplied from a power supply 10 to a DC/DC converter 20. The DC/DC converter 20 converts the supplied voltage into, for example, 1.5 V and supplies it to a collector of the amplifying part transistor Q in the power amplifier circuit 5. The amplifying part transistor Q is composed of an NPN bipolar transistor. The voltage which is supplied by the DC/DC converter 20 is variable, and in some cases a high voltage (3.6 V, for example) is supplied, while in other cases a low voltage (1.5 V, for example) is supplied.

A high-frequency signal current Isg is supplied to a base of the amplifying part transistor Q from a signal generating circuit 30 via a capacitive element C1, and a bias current Ibias from a bias circuit 40 is also supplied thereto. Namely, a base current Ib=Ibias+Isg is supplied to the base. An emitter of the amplifying part transistor Q is grounded.

The bias circuit 40 includes NPN bipolar transistors Q1 to Q4 and a resistance R1. The bipolar transistors Q1 and Q2 and the resistance R1 constitute a switching control circuit 50, and the bipolar transistors Q3 and Q4 constitute a bias current generating circuit 60.

As concerns a control voltage Vcon to be supplied to the switching control circuit 50, a voltage (3.6 V, for example) is supplied when the power amplifier circuit 5 is on, and no voltage (namely, 0 V) is supplied when it is off. In the bias current generating circuit 60, the bipolar transistor Q3 is turned on/off according to the on/off of the control voltage Vcon, and when it is on, the bias current Ibias is supplied from a reference voltage Vref to the base of the amplifying part transistor Q, and when it is off, the bias current Ibias is not supplied.

The switching control circuit 50 changes the amount of the bias current Ibias flowing through the bipolar transistor Q3 by changing the amount of a control current Icon to be supplied to a base of the bipolar transistor Q3 according to its ambient temperature (ambient temperature of the bipolar transistors Q1 and Q2). Hence, the switching control circuit 50 prevents thermal runaway of the power amplifier circuit. In addition, the bipolar transistors Q1 and Q2 also monitor the ambient temperature of the amplifying part transistor Q.

An output node N0 of this power amplifier circuit is provided on the collector side of amplifying part transistor Q and outputs a voltage output OUT. A load impedance ZL is connected to the output node N0.

As shown in FIG. 12, the amount of a current Ic flowing through the amplifying part transistor Q is determined by the base current Ib (Ib1<Ib2<Ib3<Ib4<Ib5<Ib6) which flows into the base of the amplifying part transistor Q. As stated above, the base current Ib is the sum of the bias current Ibias from the bias circuit 40 and the signal current Isg from the signal generating circuit 30. The bias current Ibias is constant unless temperature changes, and hence the voltage of the voltage output OUT is determined by the high-frequency signal current Isg from the signal generating circuit 30.

Incidentally, as shown in FIG. 12, from the characteristics of the bipolar transistor, an amplitude of the voltage output OUT can be widely at high output levels at which the voltage Vc is high, while the amplitude of the voltage output OUT can be only narrowly at low out levels at which the voltage Vc is low.

However, as can be seen from FIG. 11 and FIG. 12, even if the voltage Vc is reduced at low output levels, the amount of the current Ic flowing through the amplifying part transistor Q is unchanged. Since power consumption (DC loss) is determined by voltage Vc×current Ic, power consumption is reduced only through a fall in the voltage Vc.

When the voltage Vc is at low output levels, however, it does not matter if the amplitude of the voltage output OUT is small, and hence if it is possible to decrease the amount of the current Ic and thereby reduce power consumption, it is more desirable.

SUMMARY OF THE INVENTION

In order to accomplish the aforementioned and other objects, according to one aspect of the present invention, a power amplifier circuit, comprises:

an amplifying part transistor including a bipolar transistor to which a first supply voltage is supplied as a driving voltage and which amplifies an input signal inputted to a base of the amplifying part transistor so as to output the input signal;

a bias current generating circuit which generates a bias current for biasing the base of the amplifying part transistor and supplies the bias current to the base of the amplifying part transistor when the amplifying part transistor performs an amplification operation; and an additional bias current generating circuit which supplies an additional bias current to the base of the amplifying part transistor in addition to the bias current according to the first supply voltage.

DETAILED DESCRIPTION OF THE EMBODIMENTS

First Embodiment

In the first embodiment, a reduction in power consumption at low output levels is realized by making the amount of a base current to be supplied to an amplifying part transistor in a power amplifier circuit at low output levels smaller than that at high output levels to thereby reduce a current flowing from a collector to an emitter of the amplifying part transistor. Further details will be given below.

Figure 1:
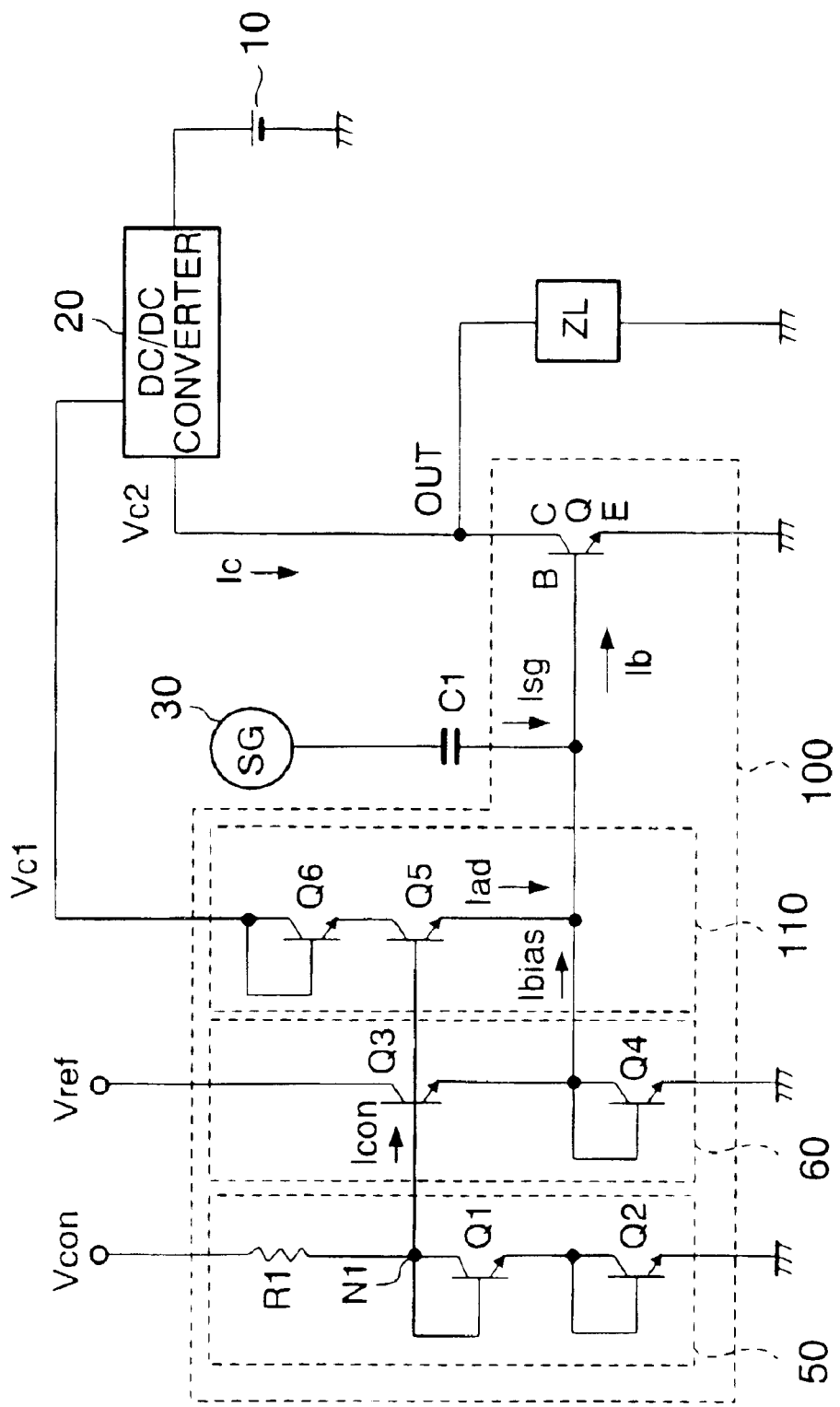
FIG. 1 is a diagram showing the configuration of a power amplifier circuit according to a first embodiment and its peripheral circuit.

FIG. 1 is a diagram showing the configuration of a power amplifier circuit 100 according to this embodiment and its peripheral circuit. As can be seen from FIG. 1, the power amplifier circuit 100 according to this embodiment is configured by adding NPN bipolar transistors Q5 and Q6 to the power amplifier circuit 5 in FIG. 11 described above.

More specifically, the bipolar transistor Q5 and the bipolar transistor Q6 are connected in series to constitute an additional bias current generating circuit 100 in this embodiment.

A voltage Vc1 is supplied to a collector of the bipolar transistor Q6 from a DC/DC converter 20. In this embodiment, this voltage Vc1 is equivalent to a voltage Vc2 which is supplied to a collector of an amplifying part transistor Q. However, a node which supplies the voltage Vc1 and a node which supplies the voltage Vc2 are short-circuited in a high frequency manner so as not to be affected by each other in the DC/DC converter 20.

Moreover, to the collector of the bipolar transistor Q6, its own base is connected. In other words, the bipolar transistor Q6 functions as a diode. An emitter of this bipolar transistor Q6 is connected to a collector of the bipolar transistor Q5.

A base of the bipolar transistor Q5 is connected to a collector of a bipolar transistor Q1. An emitter of the bipolar transistor Q5 is connected to a base of the amplifying part transistor Q. Accordingly, an additional bias current Iad which flows into the base of the amplifying part transistor Q through the bipolar transistor Q5 is controlled by the amount of a control current Icon which flows into the base of the bipolar transistor Q5 from the collector of the bipolar transistor Q1.

Figure 11:
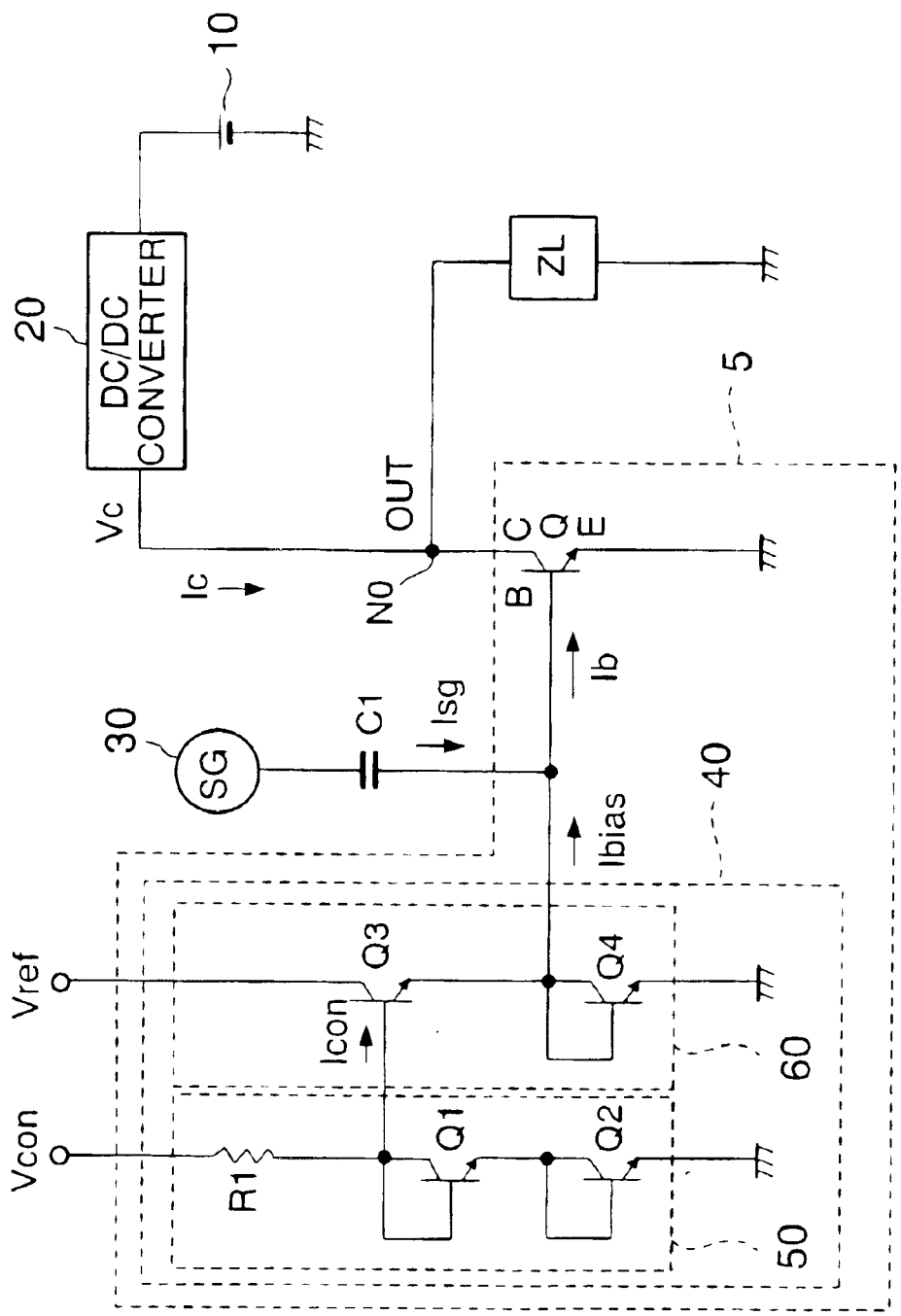
FIG. 11 is a diagram showing the configuration of a related power amplifier circuit and its peripheral circuit.
Figure 12:
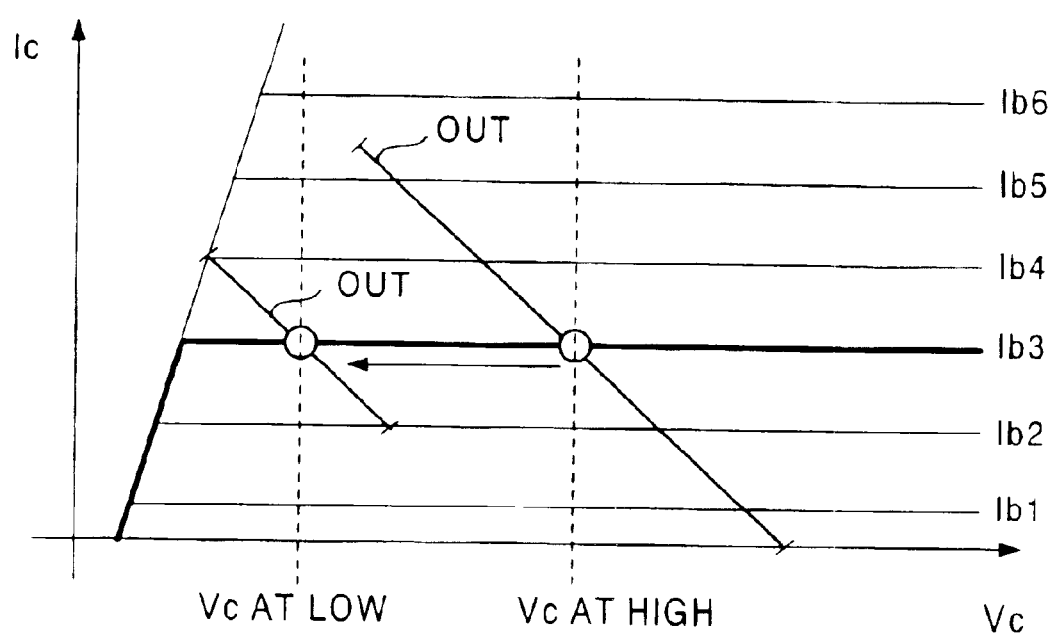
FIG. 12 is a graph showing the static characteristic of an amplifying part transistor in the related power amplifier circuit.

Similarly to FIG. 11 described above, a switching control circuit 50 includes a resistance R1 and bipolar transistors Q1 and Q2. A control voltage Vcon is supplied to one end of the resistance R1, and the other end of the resistance R1 is connected to the collector of the bipolar transistor Q1. To the collector of the bipolar transistor Q1, its own base is also connected. In other words, the bipolar transistor Q1 functions as a diode. An emitter of the bipolar transistor Q1 is connected to a collector of the bipolar transistor Q2.

To the collector of the bipolar transistor Q2, its own base is also connected. Namely, the bipolar transistor Q2 functions as a diode. An emitter of the bipolar transistor Q2 is connected to a ground. As can be seen from the above, the switching control circuit 50 has a configuration in which two diodes (Q1, Q2) are connected in series to one end of the resistance R1.

Similarly to FIG. 11 described above, a bias current generating circuit 60 includes bipolar transistors Q3 and Q4. A reference voltage Vref is supplied to a collector of the bipolar transistor Q3. A base of the bipolar transistor Q3 is connected to the collector of the bipolar transistor Q1, and an emitter of the bipolar transistor Q3 is connected to a collector of the bipolar transistor Q4 and the base of the amplifying part transistor Q. Accordingly, a bias current Ibias which flows into the base of the amplifying part transistor Q through the bipolar transistor Q3 is controlled by the amount of the control current Icon which flows into the base of the bipolar transistor Q3 from the collector of the bipolar transistor Q1.

To the collector of the bipolar transistor Q4, its own base is also connected. In other words, the bipolar transistor Q4 functions as a diode. An emitter of this bipolar transistor Q4 is connected to a ground.

The bias current which flows into the base of the amplifying part transistor Q from a point between the bipolar transistor Q3 and the bipolar transistor Q4 is Ibias, the additional bias current which flows into the base of the amplifying part transistor Q from the bipolar transistor Q5 is Iad, and a signal current which flows into the base of the amplifying part transistor Q from a signal generating circuit 30 is Isg, whereby the whole base current Ib flowing into the base of the amplifying part transistor Q is expressed as follows.

$$Ib = Ibias + Iad + Isg$$

It is noted that the high-frequency signal current Isg is inputted to the base of the amplifying part transistor Q but the signal current Isg is not inputted to the additional bias current generating circuit 110 or the bias current generating circuit 60. Moreover, the signal generating circuit 30 and the power amplifier circuit 100 are isolated from each other in a direct current manner but they are short-circuited in a high frequency manner.

The configuration of the power amplifier circuit 100 has been described above, and next the operation of this power amplifier circuit 100 will be explained.

The control voltage Vcon to be supplied to the switching control circuit 50 is a predetermined voltage (for example, 3.6 V) when the power amplifier circuit 100 is operated, while it is 0 V when the power amplifier circuit 100 is not operated, that is, it is off. Since the bipolar transistors Q3 and Q5 are turned off when the control voltage Vcon is 0 V, the amplifying part transistor Q is also turned off, and thereby the power amplifier circuit 100 does not operate. Consequently, power consumption of the power amplifier circuit 100 on standby can be reduced. The standby means a state that a predetermined voltage (for example, 3.6 V) is applied to the control voltage Vcon and the signal current Isg is not supplied from the signal generating circuit 30.

On the other hand, when the control voltage Vcon is the predetermined voltage (for example, 3.6 V), the bipolar transistors Q3 and Q5 are turned on, and the bias current Ibias and the additional bias current Iad are supplied to the base of the amplifying part transistor Q.

The amount of the current flowing through the bipolar transistors Q1 and Q2 constituting the diodes of the switching control circuit 50 changes depending on the ambient temperature of the bipolar transistors Q1 and Q2. In addition, the bipolar transistors Q1 and Q2 also monitor the ambient temperature of the amplifying part transistor Q. Namely, the flowing current increases if the ambient temperature rises, while the flowing current reduces when the ambient temperature falls. Hence, the voltage of a node N1 changes according to the temperature. In other words, if the temperature rises, the current flowing through the resistance R1 increases, whereby voltage drop in the resistance R1 increases, resulting in a fall in the voltage of the node N1. Consequently, the control current Icon which flows into the bases of the bipolar transistors Q3 and Q5 reduces. Hence, if the ambient temperature rises, the bias current Ibias and the additional bias current Iad reduce, and thereby the base current Ib which flows into the base of the amplifying part transistor Q also reduces.

On the other hand, if the temperature falls, the current flowing through the resistance R1 reduces, whereby the voltage drop in the resistance R1 reduces. Thereby the voltage of the node N1 rises, and the control current Icon which flows into the bases of the bipolar transistors Q3 and Q5 increases. Hence, if the ambient temperature falls, the bias current Ibias and the additional bias current Iad increase, and the base current Ib which flows into the base of the amplifying part transistor Q also increases. In other words, the switching control circuit 50 has a temperature compensation function. However, this temperature compensation function is not always necessary, and it is also possible to omit it. In this case, the bipolar transistors Q1 and Q2 become unnecessary.

The bias current generating circuit 60 supplies the bias current Ibias to the base of the amplifying part transistor Q according to the control current Icon which flows into the base of the bipolar transistor Q3.

The additional bias current generating circuit 110 supplies the additional bias current Iad to the base of the amplifying part transistor Q according to the control current Icon which flows into the base of the bipolar transistor Q5. In this embodiment, in particular, the additional bias current generating circuit 110 is configured in such a manner to supply the additional bias current Iad when the voltage Vc1 supplied from the DC/DC converter 20 is high (3.6 V, for example) and not to supply the additional bias current Iad when the voltage Vc1 is low (1.5 V, for example). To realize this, the additional bias current generating circuit 110 according to this embodiment satisfies the following conditions.

If in each bipolar transistor, the base-emitter on-voltage which is an on-voltage between the base and the emitter is taken as Vbeon, and the collector-emitter on-voltage which is an on-voltage between the collector and the emitter is taken an Vceon, it is recommended to set the voltage Vc1 as follows.

At High Output Levels (When the Voltage Vc1 is High)

The base(B)-emitter(E) on-voltage of the amplifying part transistor Q is taken as Vbeon(Q), the collector(C)-emitter (E) on-voltage of the bipolar transistor Q5 is taken as Vceon(Q5), and the base(B)-emitter(E) on-voltage of the bipolar transistor Q6 is taken as Vbeon(Q6). In this case, the additional bias current Iad can be supplied by satisfying the following condition.

$$Vc1 > Vbeon(Q) + Vceon(Q5) + Vbeon(Q6)$$

Consequently, the additional bias current Iad can be supplied to the base of the amplifying part transistor Q, and thus the bias point of the amplifying part transistor Q can be set high.

At Low Output Levels (When the Voltage Vc1 is Low)

At low output levels, contrary to the aforementioned high output levels, it becomes possible not to supply the additional bias current Iad by satisfying the following condition.

$$Vc1 < Vbeon(Q) + Vceon(Q5) + Vbeon(Q6)$$

Consequently, it becomes possible not to supply the additional bias current Iad to the base of the amplifying part transistor Q, and thus the bias point of the amplifying part transistor Q can be set low.

Figure 2:
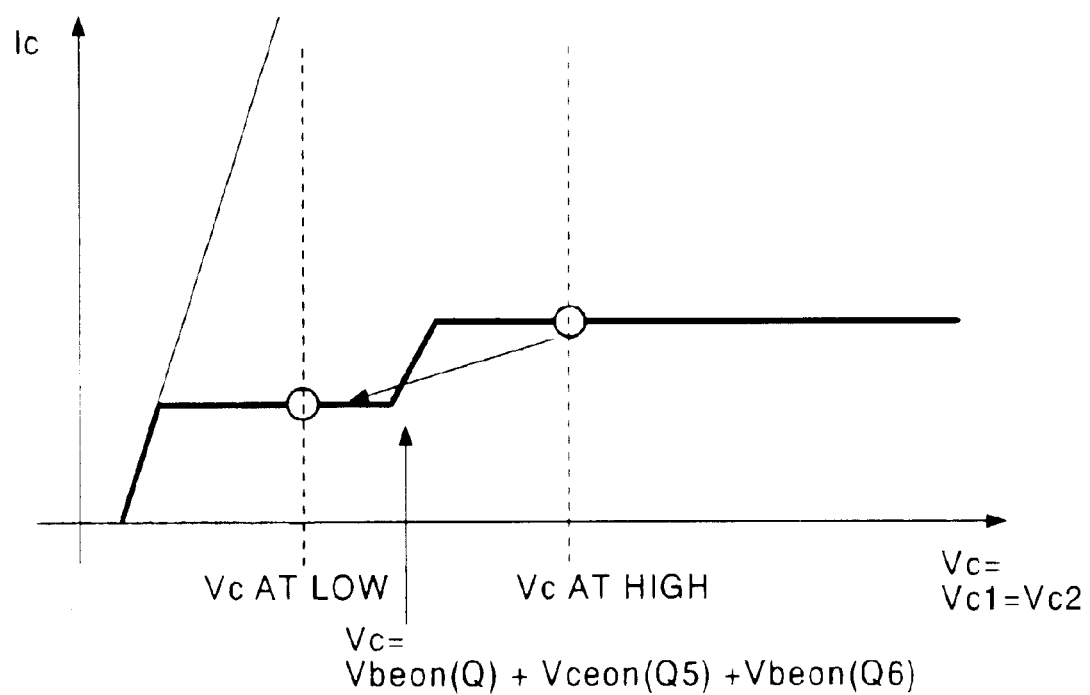
FIG. 2 is a graph showing the static characteristic of an amplifying part transistor in the power amplifier circuit according to the first embodiment.

FIG. 2 is a graph showing the static characteristic of the amplifying part transistor Q according to this embodiment. In FIG. 2, voltage Vc1=voltage Vc2=voltage Vc is a precondition as stated above. As shown in FIG. 2, according to this embodiment, the bias point of the amplifying part transistor Q at low output levels is lower than the bias point of the amplifying part transistor Q at high output levels. Therefore, the amount of the current Ic which flows through the amplifying part transistor Q from its collector to its emitter at low output levels becomes smaller, whereby power consumption which is Ic×Vc can be reduced.

Figure 3:
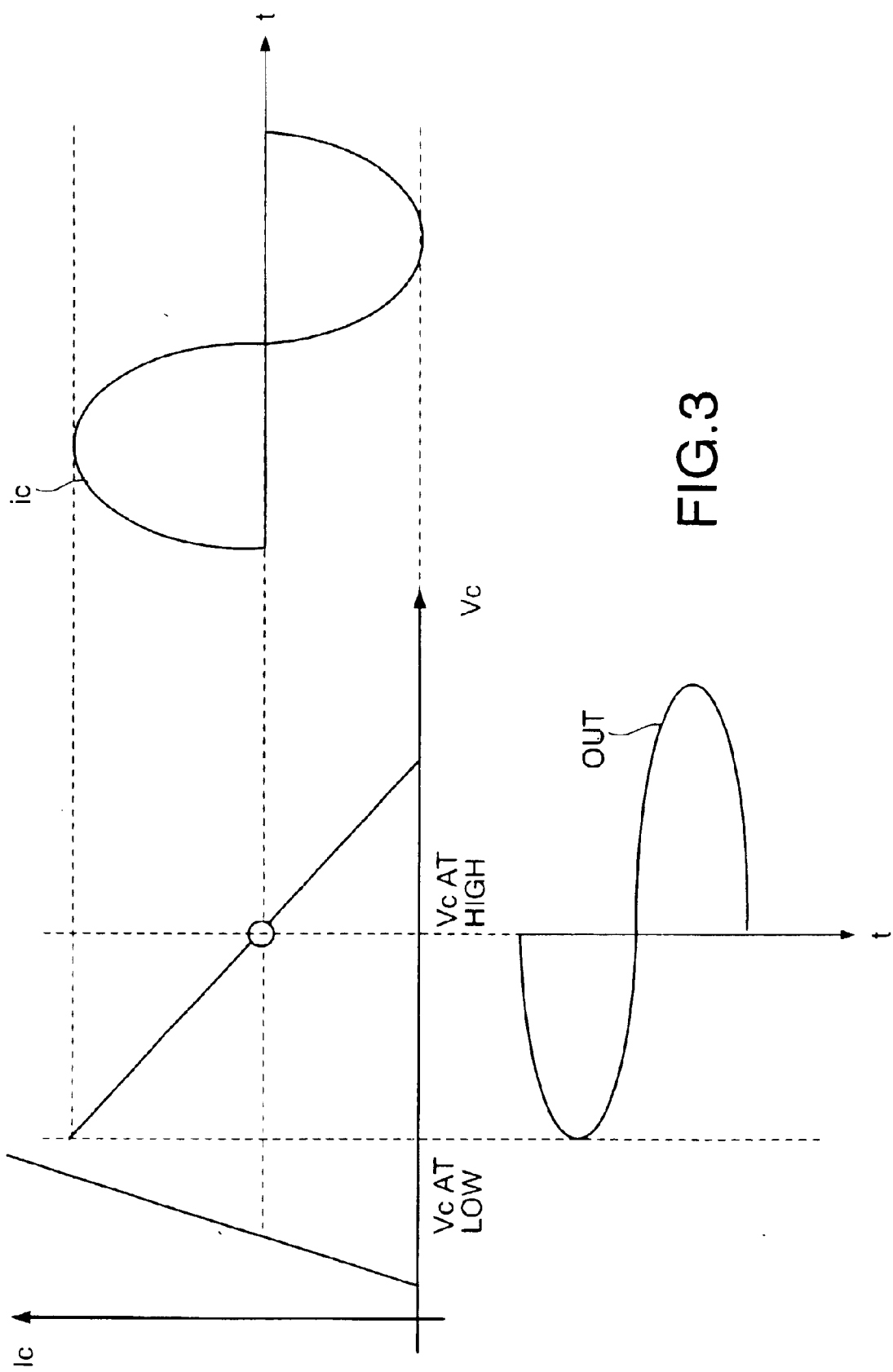
FIG. 3 is a graph showing the static characteristic of the amplifying part transistor in the power amplifier circuit according to the first embodiment and a load line of a voltage output during a high-frequency operation (at high output levels)
Figure 4:
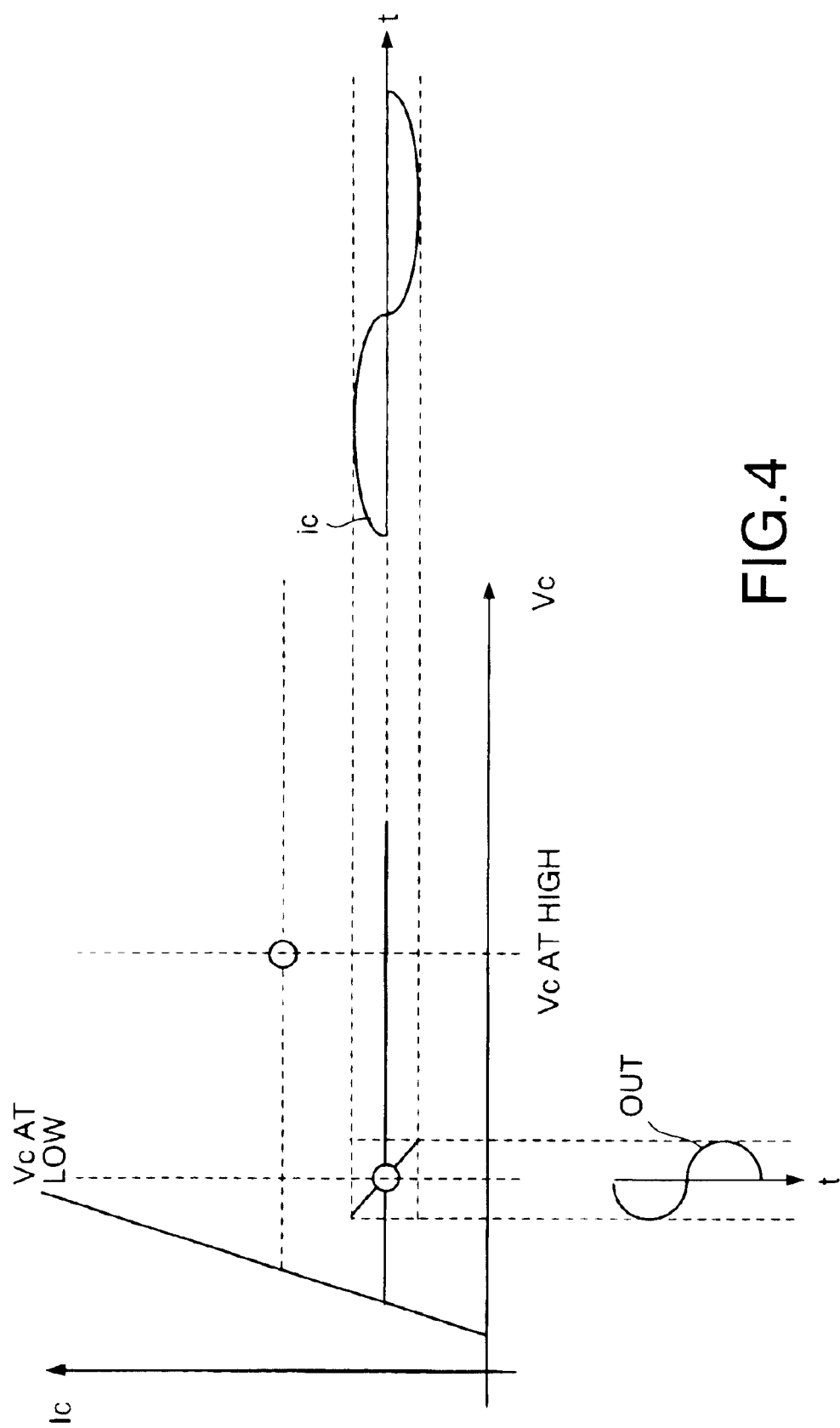
FIG. 4 is a graph showing the static characteristic of the amplifying part transistor in the power amplifier circuit according to the first embodiment and the load line of the voltage output during the high-frequency operation (at low output levels)

FIG. 3 is a graph showing the high-frequency static characteristic of the amplifying part transistor Q at high output levels, and FIG. 4 is a graph showing the high-frequency static characteristic of the amplifying part transistor Q at low output levels.

As shown in FIG. 3, at high output levels, the bias point is high, a current output ic with large amplitude is obtained, where the ic is a current flowing the collector side of the amplifying part transistor Q. Therefore, a voltage output OUT with large amplitude is obtained. Namely, the voltage output OUT forms large amplitude according to the amplitude of the signal current Isg from the signal generating circuit 30. Contrary to this, at low output levels, the bias point is low as shown in FIG. 4, the current output ic with small amplitude is obtained so that the voltage output OUT with small amplitude is obtained. Namely, the amplitude of the voltage output OUT at low output levels becomes smaller than the amplitude of the voltage output OUT at high output levels. In the power amplifier circuit 100 according to this embodiment, the amplitude of the voltage output OUT at low output levels is small as described above, and therefore, even if the bias point is lowered, no problem occurs in terms of its operation.

Second Embodiment

In the second embodiment, by inserting a resistance on the collector side of the bipolar transistor Q6, the current Ic shows a linear slope with respect to the voltage Vc1 in the region of Vc1>Vbeon(Q)+Vceon(Q5)+Vbeon(Q6) in the aforementioned first embodiment. Further details will be given below.

Figure 5A:
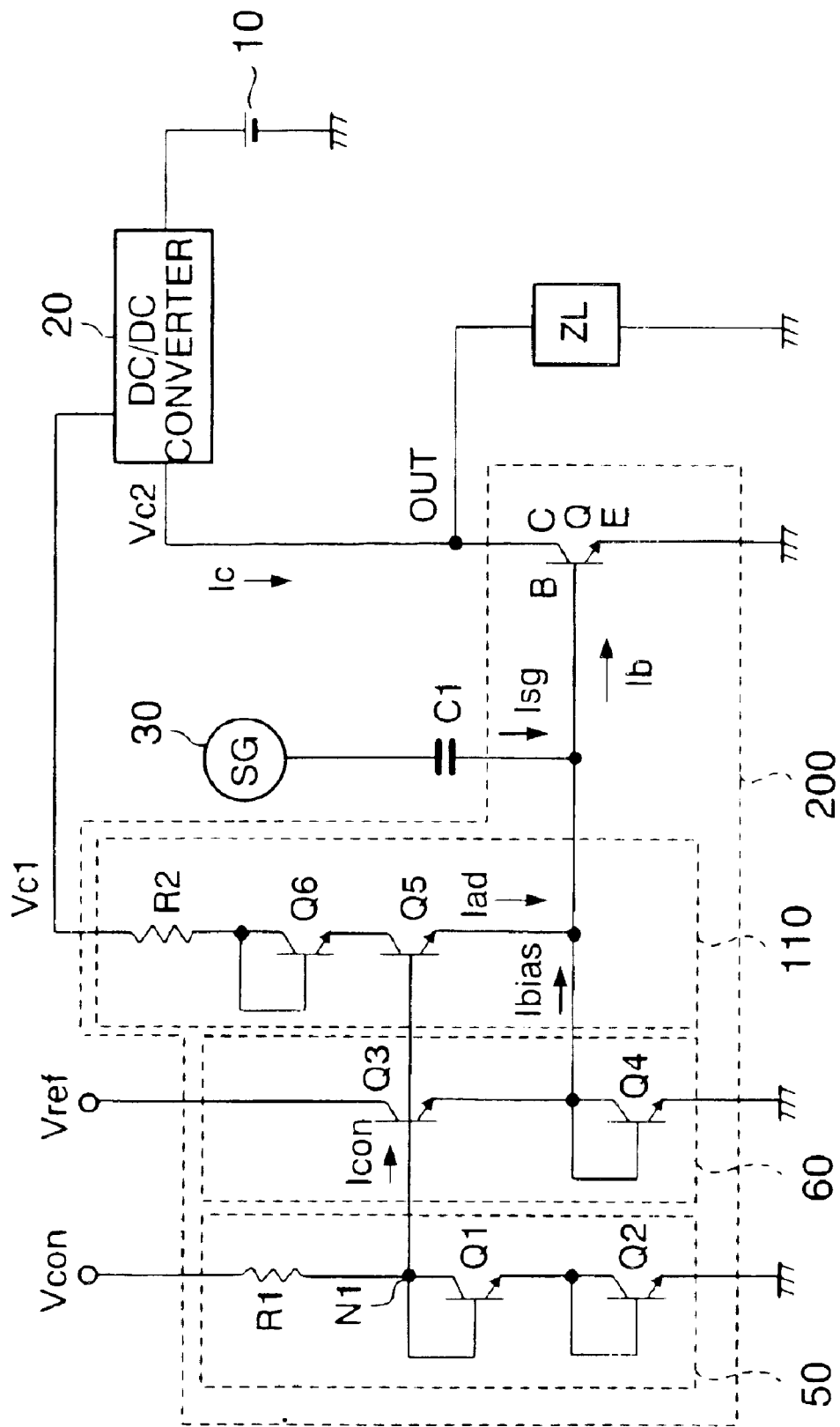
FIG. 5A is a diagram showing the configuration of a power amplifier circuit according to a second embodiment and its peripheral circuit.

FIG. 5A is a diagram showing the configuration of a power amplifier circuit 200 according to this embodiment and its peripheral circuit, and FIG. 5A corresponds to FIG. 1 described above. As shown in FIG. 5A, in the power amplifier circuit 200 according to this embodiment, a resistance R2 is additionally inserted between the collector of the bipolar transistor Q6 and the DC/DC converter 20.

Therefore, the voltage Vc1 is supplied from the DC/DC converter 20 to one end of the resistance R2 and thereafter supplied from the other end of the resistance R2 to the collector of the bipolar transistor Q6. The configuration other than this is the same as that in the aforementioned first embodiment.

The voltage Vc1 in this embodiment can be expressed as follows.

$$Vc1=Vbeon(Q)+Vceon(Q5)+Vbeon(Q6)+Iad\times R2$$

Moreover, it is defined that if the base(B)-emitter(E) on-voltage of the bipolar transistor Q5 is taken as Vbeon (Q5), this Vbeon(Q5) is determined by the switching control circuit 50 and it is constant. A graph showing the relation between the additional bias current Iad and Vceon(Q5) in this case and a graph showing the relation between the additional bias current Iad and Vbeon(Q6)+Iad×R2 are shown in FIG. 5B.

Figure 5B:
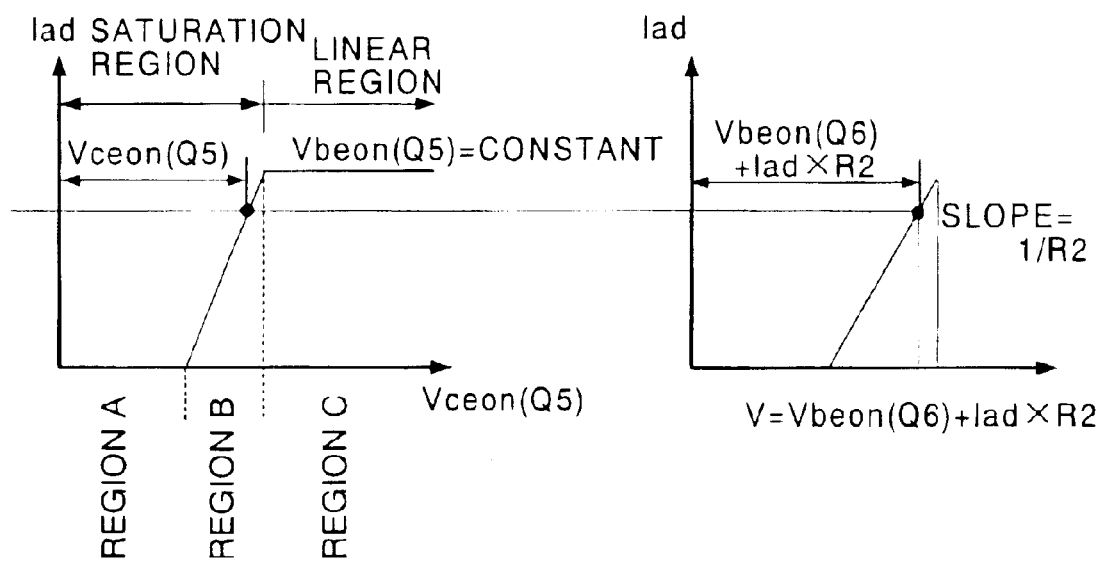
FIG. 5B shows graphs showing the relation between an additional bias current and Vceon(Q5) when the Vbeon(Q5) is constant and the relation between the additional bias current and Vbeon(Q6)+Iad×R2.

Referring to this FIG. 5B, the static characteristic of the bipolar transistor Q5 is considered divided into three regions: a region A (The additional bias current Iad is almost 0); a region B (saturation region); and a region C (linear region).

In the region A, the additional bias current Iad is almost 0, whereby the bias current of the amplifying part transistor Q is determined by the bias current generating circuit 60. Hence, the bias point of the amplifying part transistor Q is low.

In the region B, Vceon(Q5) is determined according to the amount of the flowing additional bias current Iad, and thereby Vbeon(Q6)+Iad×R2 is determined. The current flowing through the bipolar transistor Q5 is herein the additional bias current Iad, and the current flowing through the bipolar transistor Q6 and the resistance R2 is also the additional bias current Iad, whereby both are equal to each other. Therefore, from two graphs in FIG. 5B, Vceon(Q5) and Vbeon(Q6)+Iad×R2 can be found. As a result, Vc1= Vbeon(Q)+Vceon(Q5)+Vbeon(Q6)+Iad×R2 can be calculated.

In the region C, since Vbeon(Q5) is constant, the current flowing through the bipolar transistor Q5 from its collector to its emitter is constant, and in other words, the additional bias current Iad is constant. Since the additional bias current Iad is constant, Vbeon(Q6)+Iad×R2 is also constant. Vceon (Q5) at this time is expressed as follows.

$$Vceon(Q5)=Vc1-Vbeon(Q)-Vbeon(Q6)-Iad\times R2$$

Figure 6:
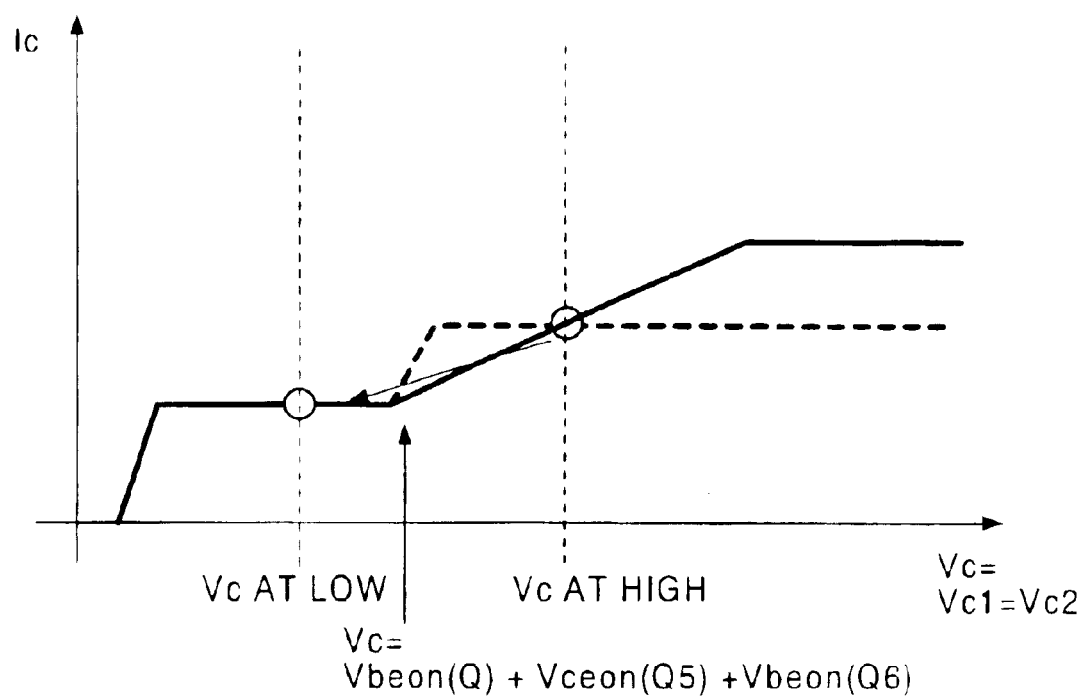
FIG. 6 is a graph showing the static characteristic of an amplifying part transistor in the power amplifier circuit according to the second embodiment.

FIG. 6 is a graph showing the static characteristic of the amplifying part transistor Q according to this embodiment. Similarly to the aforementioned first embodiment, also in FIG. 6, voltage Vc1=voltage Vc2=voltage Vc is a precondition. As shown in FIG. 6, also in this embodiment, the bias point of the amplifying part transistor Q at low output levels is lower than the bias point of the amplifying part transistor Q at high output levels. Therefore, the amount of the current Ic which flows through the amplifying part transistor Q from its collector to its emitter at low output levels becomes smaller, whereby power consumption which is Ic×Vc can be reduced.

Moreover, owing to the existence of the resistance R2, in the region of Vc1>Vbeon(Q)+Vceon(Q5)+Vbeon(Q6), the current Ic which flows from the collector to the emitter of the amplifying part transistor Q comes to show linearity. Hence, the voltage Vc at which the power amplifier circuit 200 operates can be set between high output levels at which the voltage Vc (=Vc1=Vc2) is high and low output levels at which the voltage Vc is low. Namely, a plurality of, for example, three, four, five, voltages Vc can be set as bias points, and thus the plurality of voltages Vc can be set as the operation voltages of the power amplifier circuit 200.

Figure 7:
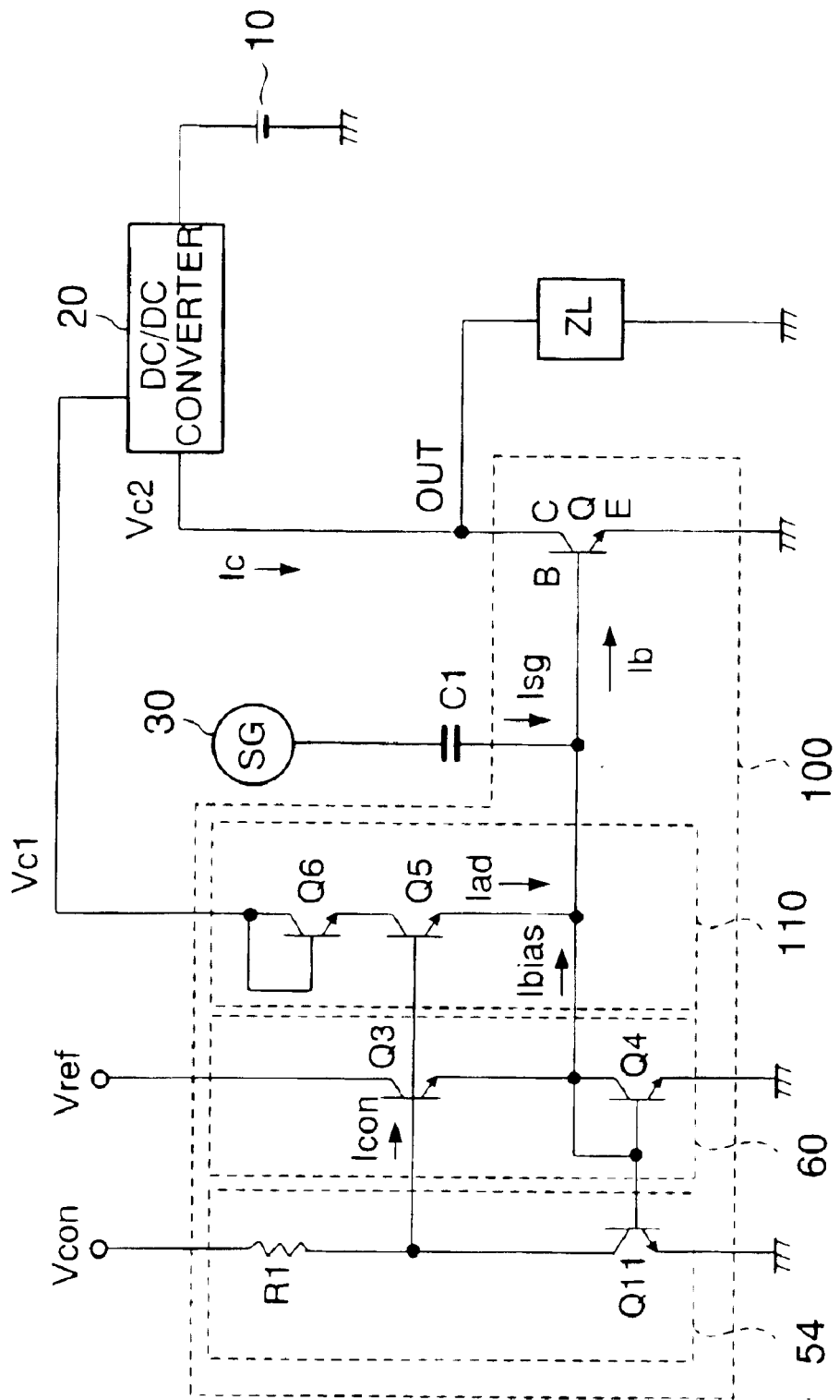
FIG. 7 is a diagram showing a modification of the power amplifier circuit according to the first embodiment.

It should be noted that the present invention is not limited to the aforementioned embodiments, and various changes may be made therein. For example, the configuration of the aforementioned switching control circuit 50 with the temperature compensation function is not limited to that in the aforementioned embodiments. For example, as shown in FIG. 7, in place of the switching control circuit 50 in the first embodiment, a switching control circuit 54 including a bipolar transistor Q11 which is connected to the bipolar transistor Q4 to form a current mirror is also suitable. In the switching control circuit 54 configured as shown in FIG. 7, the temperature compensation function is realized by the bipolar transistor Q11.

Figure 8:
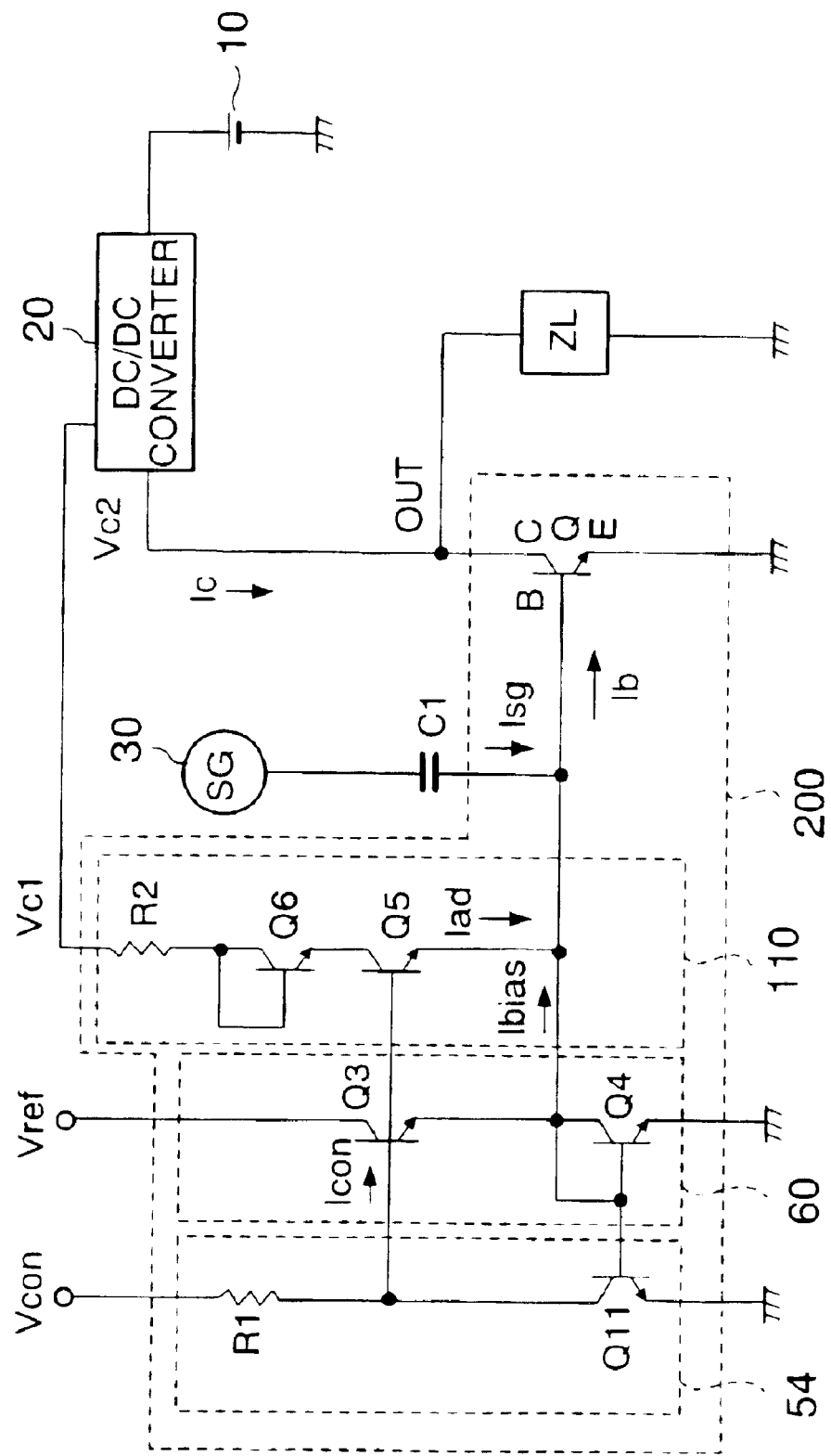
FIG. 8 is a diagram showing a modification of the power amplifier circuit according to the second embodiment.

The above also applies to the aforementioned second embodiment. If the configuration of the switching control circuit 54 is applied to the power amplifier circuit 200 according to the second embodiment, such a circuit configuration as shown in FIG. 8 is obtained.

Figure 9:
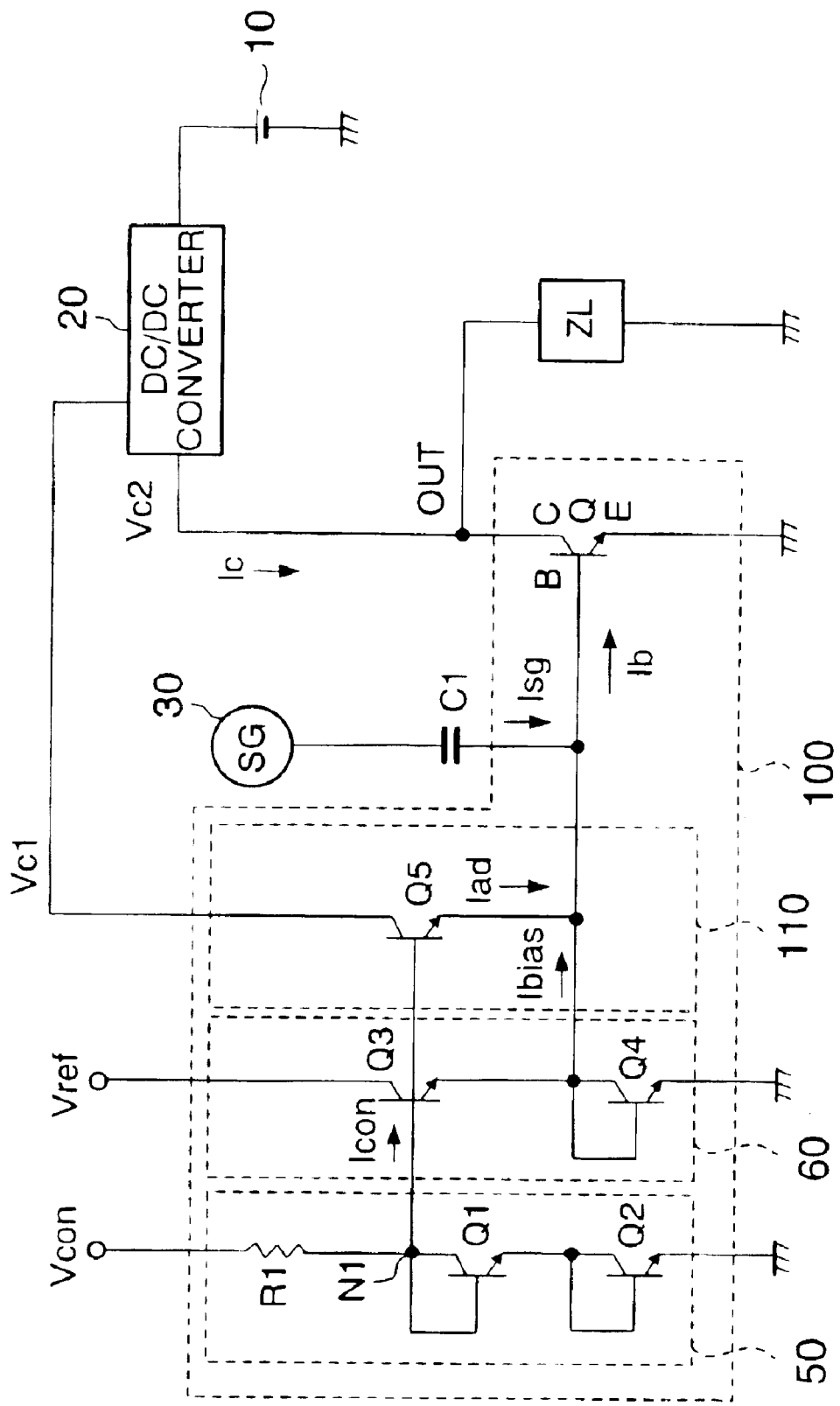
FIG. 9 is a diagram showing another modification of the power amplifier circuit according to the first embodiment.
Figure 10:
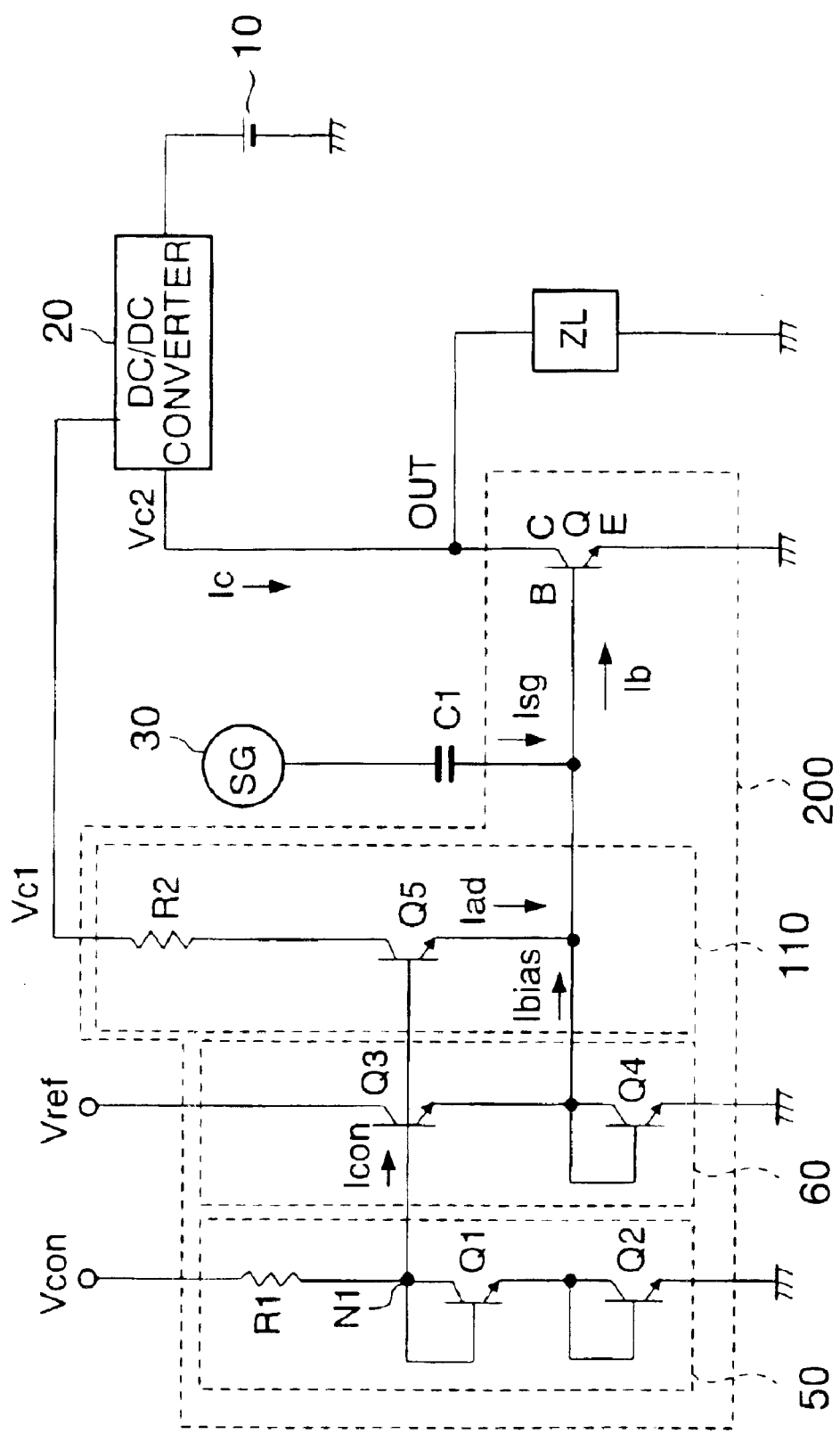
FIG. 10 is a diagram showing another modification of the power amplifier circuit according to the second embodiment.

Moreover, the number of the bipolar transistors Q6 in the aforementioned embodiments is arbitrarily selected depending on the set value of the voltage Vc1 which switches between high output and low output. Namely, the diode-connected bipolar transistor Q6 may be omitted or plural ones may be provided. In other words, the number N of the bipolar transistors Q6 may be 0, one, two, three, ***. When the bipolar transistor Q6 is omitted, the power amplifier circuit 100 according to the first embodiment has such a configuration as shown in FIG. 9, and the power amplifier circuit 200 according to the second embodiment has such a configuration as shown in FIG. 10.

In other words, the number N of the bipolar transistors Q6 has only to be 0 or a positive integer. In this case, the operating condition at high output levels (when the voltage Vc1 is high) and the operating condition at low output levels (when the voltage Vc1 is low) can be expressed as follows, for example, in the first embodiment.

At High Output Levels (When the Voltage Vc1 is High)

$$Vc1>Vbeon(Q)+Vceon(Q5)+Vbeon(Q6)\times N$$

At Low Output Levels (When the Voltage Vc1 is Low)

$$Vc1<Vbeon(Q)+Vceon(Q5)+Vbeon(Q6)\times N$$

What is claimed is:

1. A power amplifier circuit comprising:

an amplifying part transistor including a bipolar transistor to which a first supply voltage is supplied as a driving voltage and which amplifies an input signal inputted to a base of the amplifying part transistor so as to output the input signal;

a bias current generating circuit which generates a bias current for biasing the base of the amplifying part transistor and supplies the bias current to the base of the amplifying part transistor when the amplifying part transistor performs an amplification operation; and an additional bias current generating circuit which supplies an additional bias current to the base of the amplifying part transistor in addition to the bias current according to the first supply voltage, wherein the first supply voltage is supplied to a collector of the amplifying part transistor, and a second supply voltage whose value is equivalent to that of the first supply voltage is supplied to the additional bias current generating circuit, and wherein the additional bias current generating circuit supplies the additional bias current when the second supply voltage is higher than a predetermined value but the additional bias current generating circuit does not supply the additional bias current when the second supply voltage is lower than the predetermined value.

2. A power amplifier circuit comprising:

an amplifying part transistor including a bipolar transistor to which a first supply voltage is supplied as a driving voltage and which amplifies an input signal inputted to a base of the amplifying part transistor so as to output the input signal;

a bias current generating circuit which generates a bias current for biasing the base of the amplifying part transistor and supplies the bias current to the base of the amplifying part transistor when the amplifying part transistor performs an amplification operation;

an additional bias current generating circuit which supplies an additional bias current to the base of the amplifying part transistor in addition to the bias current according to the first supply voltage; and a switching control circuit which supplies a control current to the bias current generating circuit and selects whether or not the bias current generating circuit supplies the bias current to the base of the amplifying part transistor, wherein the first supply voltage is supplied to a collector of the amplifying part transistor, and a second supply voltage whose value is equivalent to that of the first supply voltage is supplied to the additional bias current generating circuit.

3. The power amplifier circuit according to claim 2, wherein the additional bias current generating circuit comprises a first bipolar transistor including an emitter connected to the base of the amplifying part transistor and a base to which the control current is supplied from the switching control circuit.

4. The power amplifier circuit according to claim 3, wherein the additional bias current generating circuit further comprises a second bipolar transistor including an emitter connected to a collector of the first bipolar transistor, a collector to which the second supply voltage is supplied, and a base connected to the collector of the second bipolar transistor.

5. The power amplifier circuit according to claim 4, wherein the additional bias current generating circuit supplies the additional bias current when the second supply voltage is higher than a sum of a base-emitter voltage of the amplifying part transistor, a collector-emitter voltage of the first bipolar transistor, and a base-emitter voltage of the second bipolar transistor, but the additional bias current generating circuit does not supply the additional bias current when the second supply voltage is lower than the sum.

6. The power amplifier circuit according to claim 5, wherein the bias current generating circuit comprises:

a third bipolar transistor including a collector connected to the base of the amplifying part transistor and a base connected to the collector of the third bipolar transistor; and a fourth bipolar transistor including an emitter connected to the collector of the third bipolar transistor, a base to which the control current is supplied from the switching control circuit, and a collector to which a third supply voltage is supplied.

7. The power amplifier circuit according to claim 6, wherein the switching control circuit has a temperature compensation function, and the control current changes according to an ambient temperature.

8. The power amplifier circuit according to claim 7, wherein the control current from the switching control circuit decreases as the ambient temperature increases, and increases as the ambient temperature decreases.

9. The power amplifier circuit according to claim 3, wherein the additional bias current generating circuit further comprises a resistance, one end of the resistance being connected to a collector of the first bipolar transistor and the other end of the resistance being supplied with the second supply voltage.

10. The power amplifier circuit according to claim 4, wherein the additional bias current generating circuit further comprises a resistance, one end of the resistance is connected to the collector of the second bipolar transistor and the other end of the resistance being supplied with the second supply voltage.

* * * * *